United States Patent
Gong et al.

(10) Patent No.: US 7,417,471 B2
(45) Date of Patent: Aug. 26, 2008

(54) VOLTAGE COMPARATOR HAVING HYSTERESIS CHARACTERISTICS

(75) Inventors: Jung Chul Gong, Seoul (KR); Chang Woo Ha, Suwon (KR); Byoung Own Min, Suwon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 11/428,340

(22) Filed: Jun. 30, 2006

(65) Prior Publication Data
US 2007/0030036 A1 Feb. 8, 2007

(30) Foreign Application Priority Data
Aug. 2, 2005 (KR) .................. 10-2005-0070553
Mar. 29, 2006 (KR) .................. 10-2006-0028621

(51) Int. Cl.
*H03D 1/00* (2006.01)
(52) U.S. Cl. .................. 327/50; 327/56; 327/77
(58) Field of Classification Search .................. 327/50, 327/56, 63, 68, 77, 87, 88
See application file for complete search history.

(56) References Cited

U.S. PATENT DOCUMENTS 6,133,772 A * 10/2000 Drapkin et al. ............. 327/206
6,600,639 B1 * 7/2003 Teo et al. .................... 361/92
6,894,542 B2 * 5/2005 Prexl et al. ................. 327/67
7,109,761 B2 * 9/2006 Isomura ..................... 327/77
7,170,330 B2 * 1/2007 Kamei ....................... 327/205

FOREIGN PATENT DOCUMENTS

| JP | 10-079652 A | 3/1998 |
| JP | 2004-304515 A | 10/2004 |
| KR | 2003-0070694 A | 9/2003 |

OTHER PUBLICATIONS

English Translation of Japanese Office Action dispatched Jan. 8, 2008.

* cited by examiner

*Primary Examiner*—N. Drew Richards
*Assistant Examiner*—Hai L. Nguyen
(74) *Attorney, Agent, or Firm*—Lowe Hauptman Ham & Berner

(57) ABSTRACT

A voltage comparator having hysteresis includes a comparing section that compares an input voltage with a reference voltage so as to output a high-level or low-level signal; and a reference voltage changing section that changes the reference voltage when a low-level signal is output from the comparing section.

13 Claims, 4 Drawing Sheets

[FIG. 1] – PRIOR ART
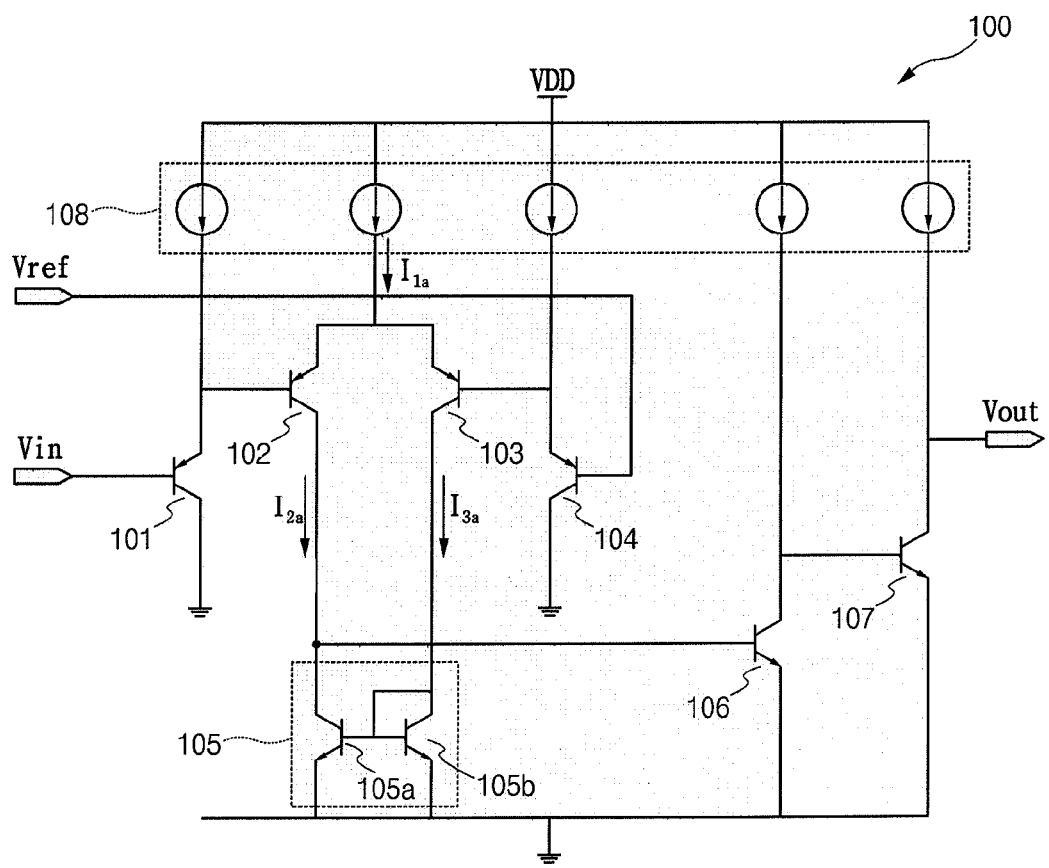

[FIG. 2] – PRIOR ART
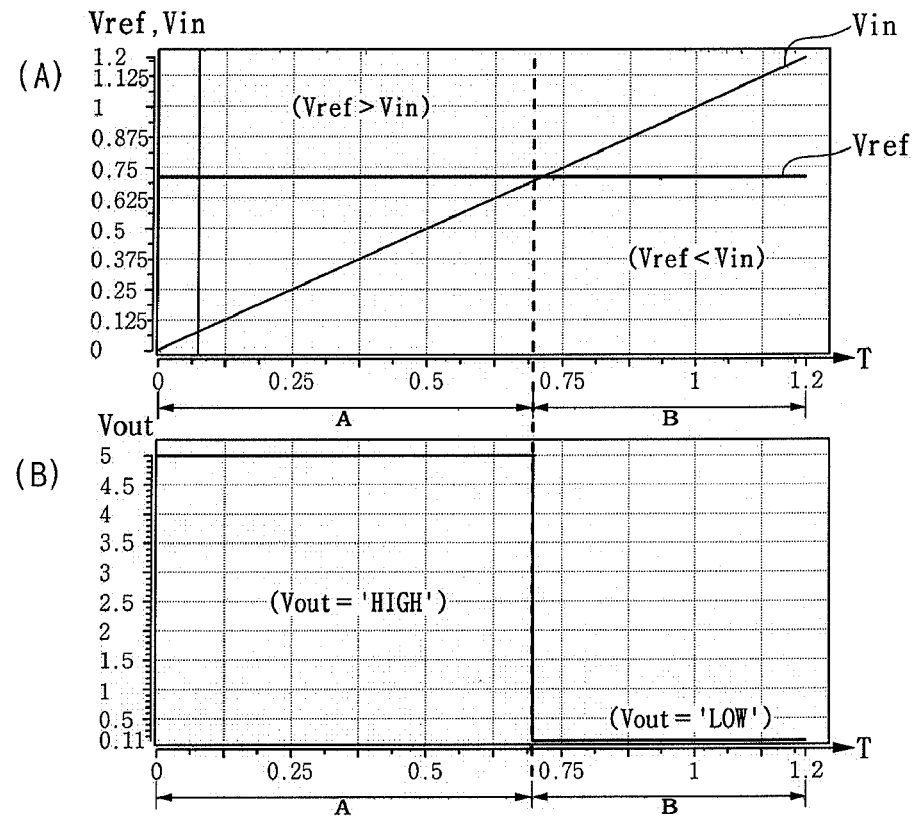
[FIG. 3] – PRIOR ART
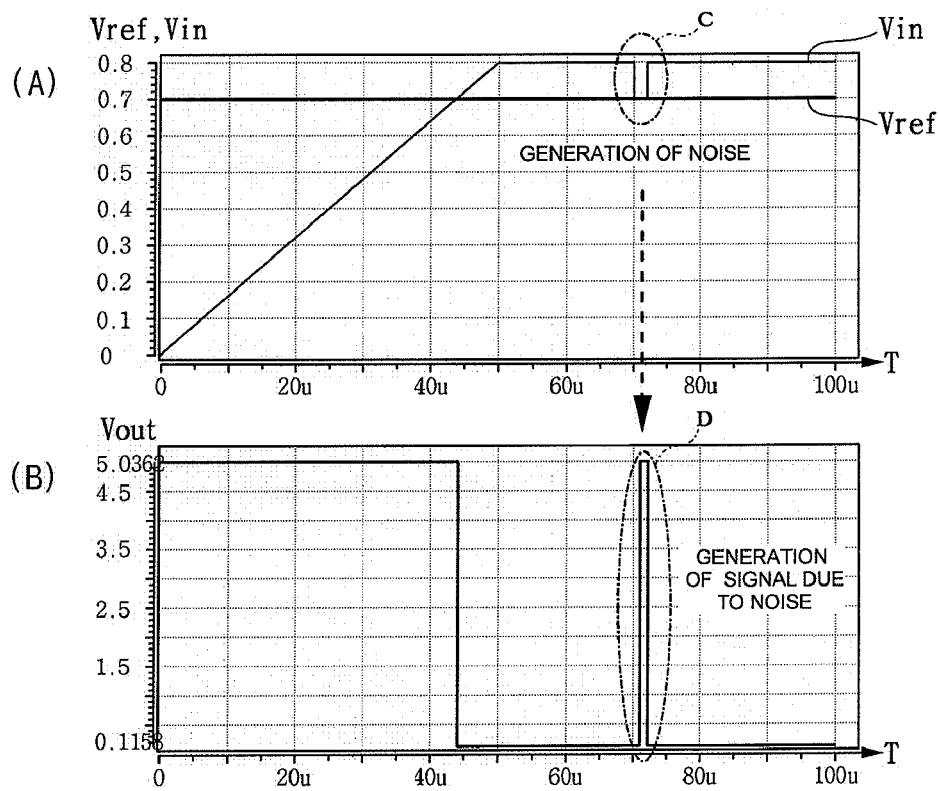

[FIG. 4]
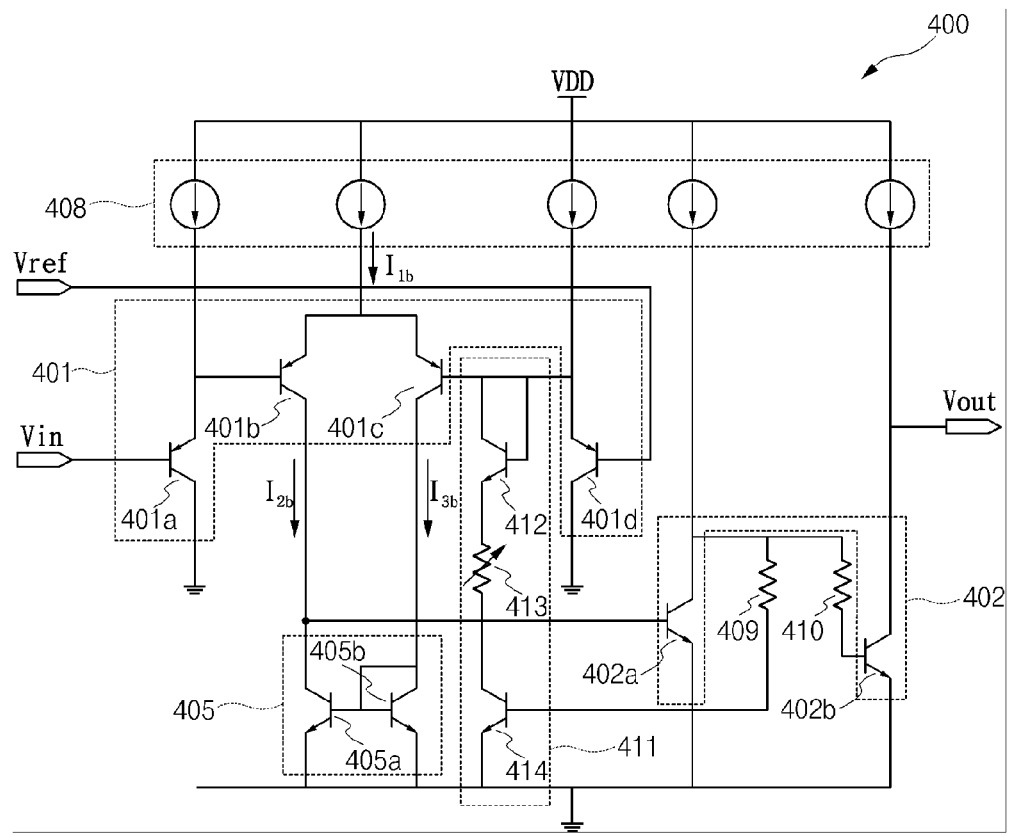
[FIG. 5]
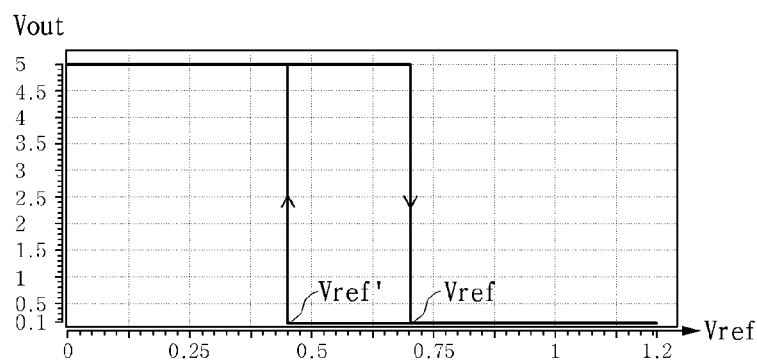

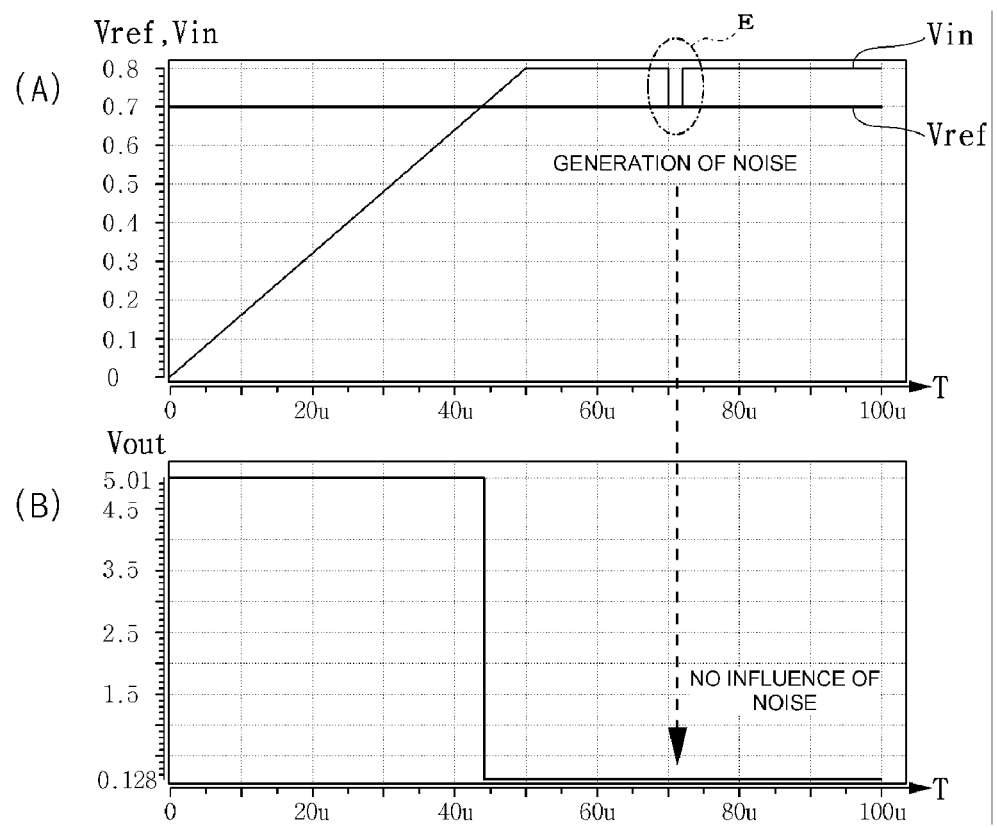

a common terminal of the second and third transistors 102 and 103 so as to maintain a constant amount of current.

VOLTAGE COMPARATOR HAVING HYSTERESIS CHARACTERISTICS

CROSS-REFERENCE TO RELATED APPLICATIONS

The application claims the benefit of Korea Patent Application Nos. 2006-0028621 filed with the Korea Industrial Property Office on Mar. 29, 2006 and 2005-0070553 filed with the Korea Industrial Property Office on Aug. 2, 2005, the disclosures of which are incorporated herein by reference.

BACKGROUND OF THE INVENTION

1. Field of the Invention

The present invention relates to a voltage comparator having hysteresis characteristics, and more specifically, to a voltage comparator having hysteresis characteristics, in which a reference voltage changing section composed of a small number of elements is added so that a voltage comparator safe from input noise can be designed and the magnitude of a hysteresis voltage can be accurately set and simply changed by varying the value of a resistance.

2. Description of the Related Art

In general, a voltage comparator compares an input voltage with a reference voltage and amplifies the difference therebetween so as to output a high-level or low-level signal. Since a conventional voltage comparator does not have a function of compensating for noise with respect to an output, a separate analog or digital compensating circuit is added thereto.

As a circuit added to the voltage comparator in order to solve the noise problem, there is provided a Schmitt trigger circuit having hysteresis characteristics. However, the Schmitt trigger circuit is sensitive to process variation when determining a positive threshold voltage Vth+ and negative threshold voltage Vth−.

Recently, a voltage comparator itself is designed to have hysteresis characteristics.

After comparing an input voltage with a reference voltage, the voltage comparator having hysteresis characteristics outputs a high-level or low-level signal if the input voltage is larger than the reference voltage. That is, the voltage comparator is used in comparing an input signal.

The voltage comparator having hysteresis characteristics has two points where the output changes, that is, an upper reference voltage and lower reference voltage.

In order to implement a voltage comparator which is safe from noise, the voltage comparator should be designed to have hysteresis characteristics. Accordingly, if the hysteresis characteristics are varied in accordance with a process, an error is generated in the voltage comparator itself, thereby deteriorating the reliability of the overall semiconductor.

FIG. 1 is a circuit diagram showing a voltage comparator 100 according to the related art. As shown in FIG. 1, the conventional voltage comparator 100 is composed of first and second transistors 101 and 102 which are driven by the input voltage Vin, third and fourth transistors 103 and 104 which are driven by the reference voltage Vref, a voltage drop unit 105 which is connected to the second and third transistors 102 and 103 and a ground terminal so as to generate a voltage drop, a fifth transistor 106 which is connected to the second transistor 102 and a ground terminal so as to be driven by the voltage generated by the voltage drop unit 105, a sixth transistor 107 which is connected to the fifth transistor 106 and a ground terminal so as to be driven by a power supply voltage, and a bias current section 108 which is connected to the first, fourth, fifth, and sixth transistors 101, 104, 106, and 107 and The first to fourth transistors 101 to 104 are composed of PNP transistors, and the fifth and sixth transistors 106 and 107 are composed of NPN transistors.

The voltage drop unit 105 is composed of seventh and eighth transistors 105a and 105b connected in a current mirror relationship, and the seventh and eighth transistors 105a and 105b are composed of NPN transistors.

When the voltage comparator 100 having such a construction compares the input voltage Vin and the reference voltage Vref so as to output a high-level or low-level signal, the process is explained in FIG. 2, and will be described in detail as follows.

FIG. 2 is a diagram showing an operational process of the conventional voltage comparator with an output signal according thereto. FIG. 2A shows an input voltage Vin and reference voltage Vref of the voltage comparator in accordance with time. FIG. 2B shows an output signal Vout of the voltage comparator in accordance with time.

First, when the input voltage Vin is smaller than the reference voltage Vref, that is, in an interval A, the second transistor 102 is turned on and the third transistor 103 is turned off, because of a characteristic of PNP transistors. Then, the bias current $I_{1a}$ of the voltage comparator 100 flows into $I_{2a}$. Accordingly, a voltage drop is generated in the voltage drop unit 105, so that a constant voltage is applied to the emitter of the fifth transistor 106. At this time, since the voltage is larger than the threshold voltage of the fifth transistor 106, the fifth transistor 106 is turned on.

Therefore, the emitter of the sixth transistor 107 receives a collector-emitter voltage of the fifth transistor 106. Since the voltage, which is about 0.1 V, is less than the threshold voltage of the sixth transistor 107, the sixth transistor 107 is turned off.

Then, the output terminal of the voltage comparator 100 receives a power supply voltage VDD, so that a high-level signal is accordingly output, as shown in FIG. 2B.

When the input voltage Vin is larger than the reference voltage Vref, that is, in an interval B, the second transistor 102 is turned off and the third transistor 103 is turned on, because of a characteristic of PNP transistors. Then, the bias current $I_{1a}$ of the voltage comparator 100 flows into $I_{3a}$. In this case, a voltage drop is not generated in the voltage drop unit 105, and an emitter voltage which can turn on the fifth transistor 106 is not applied. Accordingly, the fifth transistor 106 is turned off.

Therefore, the emitter of the sixth transistor 107 receives a power supply voltage VDD of the voltage comparator 100. Then, the sixth transistor 107 is turned on, so that a low-level signal is output to the output terminal of the voltage comparator 100, as shown in FIG. 2B.

FIG. 3 is a diagram showing an output signal in accordance with the input noise in the conventional voltage comparator. FIG. 3A shows an input voltage Vin and reference voltage Vref when noise is generated in an interval where the input voltage Vin is larger than the reference voltage Vref. FIG. 3B shows an output signal when the noise is generated.

In a stable voltage comparator, the output of the voltage comparator is maintained at low level, even though noise C is generated in the input voltage Vin at an interval where the input voltage Vin is larger than the reference voltage Vref. However, the above-described conventional voltage comparator responds to the noise C so as to output a high-level signal, as shown in FIG. 3.

SUMMARY OF THE INVENTION

An advantage of the present invention is that it provides a voltage comparator having hysteresis characteristics, in which a reference voltage changing section composed of a small number of elements is added so that a voltage comparator safe from input noise can be designed and the magnitude of a hysteresis voltage can be accurately set and simply changed by varying the value of a resistance.

Additional aspects and advantages of the present general inventive concept will be set forth in part in the description which follows and, in part, will be obvious from the description, or may be learned by practice of the general inventive concept.

According to an aspect of the invention, a voltage comparator having hysteresis characteristics includes a comparing section that compares an input voltage with a reference voltage so as to output a high-level or low-level signal; and a reference voltage changing section that changes the reference voltage when a low-level signal is output from the comparing section.

The comparing section includes a switching section that is driven by the input voltage and the reference voltage; a voltage drop unit that is connected to the switching section and a ground terminal so as to generate a voltage drop; a signal output section that is connected to the voltage drop unit so as to output a high-level or low-level signal through an output terminal; and a bias current section that is connected to the switching section and the signal output section so as to maintain a constant amount of current.

The switching section includes first and second transistors that are driven by the input voltage; and third and fourth transistors that are driven by the reference voltage.

The signal output section includes a fifth transistor that is connected to the second transistor and a ground terminal so as to be driven by the voltage generated by the voltage drop unit; and a sixth transistor that is connected to the fifth transistor and the ground terminal so as to be driven by a power supply voltage.

The first to fourth transistors are PNP transistors, and the fifth and sixth transistors are NPN transistors.

The voltage drop unit is composed of seventh and eighth transistors connected in a current mirror relationship.

The seventh and eighth transistors are NPN transistors.

The reference voltage changing section includes a ninth transistor that is connected to the third and fourth transistors; a first resistance that is serially connected to the ninth transistor; and a tenth transistor that is connected to the first resistance, a ground terminal, and a common terminal of the fifth and sixth transistors.

When the input voltage is smaller than the reference voltage, the second and fifth transistors are turned on and the third and sixth transistors are turned off, so that the comparing section outputs a high-level signal through an output terminal.

The tenth transistor of the reference voltage changing section is turned off.

When the input voltage is larger than the reference voltage, the third and sixth transistors of the comparing section are turned on and the second and fifth transistors are turned off, so that the comparing section outputs a low-level signal through an output terminal.

The ninth and tenth transistors of the reference voltage changing section are turned on.

The first resistance is a variable resistance of which the value can be varied.

In order to protect the sixth transistor, a second resistance is connected between the collector of the fifth transistor and the base of the tenth transistor, and a third resistance is connected between the collector of the fifth transistor and the base of the sixth transistor.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a circuit diagram showing a conventional voltage comparator;

FIG. 2 is a diagram showing an operational process of the conventional voltage comparator and an output signal according thereto;

FIG. 3 is a diagram showing an output signal in accordance with input noise in the conventional voltage comparator;

FIG. 4 is a circuit diagram showing a voltage comparator according to the present invention;

FIG. 5 is a diagram showing hysteresis characteristics of the voltage comparator according to the invention; and FIG. 6 is a diagram showing an output signal in accordance with input noise of the voltage comparator.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

FIG. 4 is a circuit diagram showing a voltage comparator according to the present invention. As shown in FIG. 4, the voltage comparator is composed of a comparing section 400 which compares an input voltage Vin with a reference voltage Vref so as to output a high-level or low-level signal and a reference voltage changing section 411 which changes the reference voltage Vref when a low-level signal is output from the comparing section 400.

The comparing section 400 is composed of a switching section 401 which is driven by the input voltage Vin and the reference voltage Vref, a voltage drop unit 405 which is connected to the switching section 401 and a ground terminal so as to generate a voltage drop, a signal output section 402 which is connected to the voltage drop section 405 so as to output a high-level or low-level signal through an output terminal, and a bias current section 408 which is connected to the switching section 401 and the signal output section 402 so as to maintain a constant amount of current.

The switching section 401 is composed of first and second transistors 401a and 401b which are driven by the input voltage Vin and third and fourth transistors 401c and 401d which are driven by the reference voltage Vref.

The signal output section 402 is composed of a fifth transistor 402a which is connected to the second transistor 401b and a ground terminal so as to be driven by the voltage generated by the voltage drop unit 405 and a sixth transistor 402b which is connected to the fifth transistor 402a and the ground terminal so as to be driven by a power supply voltage VDD.

The first to fourth transistors 401a to 401d are composed of PNP transistors, and the fifth and sixth transistors 402a and 402b are composed of NPN transistors.

The voltage drop unit 405 is composed of seventh and eighth transistors 405a and 405b connected in a current mirror relationship. The seventh and eighth transistors 405a and 405b are composed of NPN transistors.

The reference voltage changing section 411 is composed of a ninth transistor 412 which is connected to the third and fourth transistors 401c and 401d, a first resistance 413 which is serially connected to the ninth transistor 412, and a tenth transistor 414 which is connected to the first resistance 413, a ground terminal, and a common terminal of the fifth and sixth transistors 406 and 407.

The first resistance 413 is a variable resistance of which the value can be varied. By varying the value of the variable resistance, the magnitude of a hysteresis voltage to be described below can be set accurately and can be varied simply.

Only if a voltage applied to the sixth transistor 402b is larger than the threshold voltage (0.7V in general) of the sixth transistor 402b, the sixth transistor 402b is turned on. Therefore, when the overall power supply voltage VDD is applied to the emitter of the sixth transistor 402b, the sixth transistor 402b can be damaged because a voltage larger than the standard voltage of the sixth transistor 402b is applied. Accordingly, a second resistance 409 is connected between the collector of the fifth transistor 402a and the base of the tenth transistor 414, and a third resistance 410 is connected between the collector of the fifth transistor 402a and the base of the sixth transistor 402b, thereby preventing the overvoltage from being applied to the emitter of the sixth transistor 402b.

When the voltage comparator having such a construction compares the input voltage Vin and the reference voltage Vref so as to output a high-level or low-level signal, the process will be described as follows.

First, if the input voltage Vin is smaller than the reference voltage Vref, the second transistor 401b is turned on and the third transistor 401c is turned off, because of a characteristic of PNP transistors. Then, a bias current $I_{1b}$ of the voltage comparator flows into $I_{2b}$. Accordingly, a voltage drop is generated in the voltage drop unit 405, so that a constant voltage is applied to the emitter of the fifth transistor 402a. At this time, since the magnitude of the voltage is larger than that of the threshold voltage of the fifth transistor 402a, the fifth transistor 402a is turned on.

Therefore, the emitter of the sixth transistor 402b receives a collector-emitter voltage of the fifth transistor 402a. Since the voltage, which is typically about 0.1V, is less than the threshold voltage of the sixth transistor 402b, the sixth transistor 402b is turned off. At this time, the emitter of the sixth transistor 402b is connected to the emitter of the tenth transistor 414. Therefore, the collector-emitter voltage of the fifth transistor 402a is applied to the emitter of the tenth transistor 414, so that the tenth transistor 414 is also turned off. Accordingly, when the input voltage Vin is smaller than the reference voltage Vref, the reference voltage changing section 411 does not have an influence on the voltage comparator at all.

On the other hand, when the input voltage Vin is larger than the reference voltage Vref, the second transistor 401b is turned off and the third transistor 401c is turned on, because of a characteristic of PNP transistors. Then, the bias current $I_{1b}$ of the voltage comparator flows into $I_{3b}$, so that a voltage drop is not generated in the voltage drop unit 405. Accordingly, since such an emitter voltage that can turn on the fifth transistor 402a is not applied, the fifth transistor 402a is turned off.

Therefore, the emitter of the sixth transistor 402b receives the power supply voltage VDD of the voltage comparator. Then, the sixth transistor 402b is turned on to output a low-level signal to the output terminal of the voltage comparator.

At this time, since the emitter of the sixth transistor 402b is connected to the emitter of the tenth transistor 414, the power supply voltage VDD is also applied to the emitter of the tenth transistor 414. Then, the tenth transistor 414 is turned on.

Therefore, a current flows through the ninth transistor 412, the first resistance 413, and the tenth transistor 414. The emitter voltage of the third transistor 401c can be expressed by the sum of an emitter-base voltage $V_{BE}$ of the ninth transistor 412, a voltage $V_{R1}$ applied to both sides of the first resistance 413, and a collector-base voltage Vsat of the tenth transistor 414. From this moment, the reference voltage is changed into $V_{BE}+V_{R1}+Vsat$ (hereinafter, referred to as Vref'). FIG. 5 is a diagram showing hysteresis characteristics of the voltage comparator according to the invention. FIG. 6 is a diagram showing an output signal in accordance with input noise in the voltage comparator according to the invention. FIG. 6A shows an input voltage Vin and reference voltage Vref when noise is generated at an interval where the input voltage Vin is larger than the reference voltage Vref, and FIG. 6B shows an output signal when the noise is generated. As shown in FIG. 5, a reference voltage when the output signal changes from high level to low level is the reference voltage Vref, but a reference voltage when the output signal changes from low level to high level becomes the reference voltage Vref'.

Once the output signal is changed from high level to low level, a high-level signal is output only in a case where the input voltage Vin is smaller than the reference voltage Vref'. Then, the voltage comparator according to the present invention has the hysteresis characteristics. Further, when noise E smaller than the magnitude (difference between Vref and Vref') of the hysteresis voltage is generated, the voltage comparator maintains a low-level output without responding to the noise E, as shown in FIG. 6.

In the voltage comparator having hysteresis characteristics according to the present invention, the reference voltage changing section composed of a small number of elements is added inside the circuit, which makes it possible to design a voltage comparator which is safe from input noise.

As the reference voltage changing section is constructed by using a variable resistance, the magnitude of the hysteresis voltage can be accurately set and can be simply changed by varying the value of the resistance.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A voltage comparator having hysteretic characteristics, said voltage comparator comprising:
    a comparing section for comparing an input voltage with a reference voltage so as to output a high-level signal or a low-level signal; and
    a reference voltage changing section for changing the reference voltage when the low-level signal is outputted from the comparing section;

wherein the comparing section includes:

a switching section that is driven by the input voltage and the reference voltage;

a voltage drop unit that is connected to the switching section and a ground terminal so as to generate a voltage drop;

a signal output section that is connected to the voltage drop unit so as to output the high-level or low-level signal through an output terminal; and a bias current section that is connected to the switching section and the signal output section so as to maintain a constant amount of current.

2. The voltage comparator according to claim 1, wherein the voltage drop unit comprises seventh and eighth transistors connected in a current mirror relationship.

3. The voltage comparator according to claim 2, wherein the seventh and eighth transistors are NPN transistors.

4. The voltage comparator according to claim 1, wherein the switching section includes:

first and second transistors that are driven by the input voltage; and third and fourth transistors that are driven by the reference voltage.

5. The voltage comparator according to claim 4, wherein the signal output section includes:

a fifth transistor that is connected to the second transistor and the ground terminal so as to be driven by the voltage drop generated by the voltage drop unit; and a sixth transistor that is connected to the fifth transistor and the ground terminal so as to be driven by a power supply voltage.

6. The voltage comparator according to claim 5, wherein the first to fourth transistors are PNP transistors, and the fifth and sixth transistors are NPN transistors.

7. The voltage comparator according to claim 6, wherein the reference voltage changing section includes:

a ninth transistor that is connected to the third and fourth transistors;

a first resistance that is serially connected to the ninth transistor; and a tenth transistor that is connected to the first resistance, the ground terminal, and a common terminal of the fifth and sixth transistors.

8. The voltage comparator according to claim 7, wherein, when the input voltage is larger than the reference voltage, the third and sixth transistors are turned on and the second and fifth transistors are turned off, so that the comparing section outputs the low-level signal through the output terminal.

9. The voltage comparator according to claim 8, wherein, when the input voltage is larger than the reference voltage, the ninth and tenth transistors of the reference voltage changing section are turned on.

10. The voltage comparator according to claim 7, wherein, when the input voltage is smaller than the reference voltage, the second and fifth transistors are turned on and the third and sixth transistors are turned off, so that the comparing section outputs the high-level signal through the output terminal.

11. The voltage comparator according to claim 10, wherein, when the input voltage is smaller than the reference voltage, the tenth transistor of the reference voltage changing section is turned off.

12. The voltage comparator according to claim 11, wherein, in order to protect the sixth transistor, a second resistance is connected between the collector of the fifth transistor and the base of the tenth transistor, and a third resistance is connected between the collector of the fifth transistor and the base of the sixth transistor.

13. The voltage comparator according to claim 11, wherein the first resistance is a variable resistance.

* * * * *